United States Patent
Schirl

(10) Patent No.: US 6,650,104 B1
(45) Date of Patent: Nov. 18, 2003

(54) DEVICE FOR DETECTING IMPEDANCE DISTURBANCE POINTS IN SYMMETRICAL DATA TRANSMISSION LINES

(75) Inventor: Werner Schirl, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/936,002

(22) PCT Filed: Feb. 25, 2000

(86) PCT No.: PCT/DE00/00540

§ 371 (c)(1),
(2), (4) Date: Sep. 7, 2001

(87) PCT Pub. No.: WO00/54065

PCT Pub. Date: Sep. 14, 2000

(30) Foreign Application Priority Data

Mar. 8, 1999 (DE) .......................................... 199 10 016

(51) Int. Cl.[7] ..................... G01R 31/28; G01R 19/00; H02H 3/00
(52) U.S. Cl. .................. 324/117 H; 324/117 R; 324/126; 361/42; 361/58; 714/712
(58) Field of Search .................... 324/126, 117 H, 324/117 R; 361/1–138; 714/712

(56) References Cited

U.S. PATENT DOCUMENTS

| | | | | |
|---|---|---|---|---|
| 5,399,965 | A | | 3/1995 | Heberle .................. 324/117 H |
| 5,452,308 | A | * | 9/1995 | Kaminski et al. ........... 714/712 |
| 5,793,780 | A | * | 8/1998 | Strauss ........................ 714/819 |
| 5,933,306 | A | * | 8/1999 | Santos et al. .................. 361/45 |
| 6,421,214 | B1 | * | 7/2002 | Packard et al. ................ 361/7 |

FOREIGN PATENT DOCUMENTS

| | | | |
|---|---|---|---|
| DE | 4205241 | 7/1992 | .......... H04L/25/20 |
| EP | 0 307 729 | 9/1988 | .......... G01R/15/00 |
| EP | 0 875 995 | 4/1998 | .......... H01R/19/175 |

* cited by examiner

*Primary Examiner*—Kamand Cuneo
*Assistant Examiner*—Emily Y Chan
(74) *Attorney, Agent, or Firm*—Foley & Lardner

(57) ABSTRACT

A device for detecting impedance disturbance points in symmetrical data transmission lines includes an evaluation unit having at least two magnetosensitive elements. One of these elements is positioned in the proximity of the first conductor strand and a second one is positioned in the proximity of the second conductor strand. The evaluation unit contains furthermore an evaluation circuit which is connected to the magnetosensitive elements and supplies at an output terminal a fault signal which provides information on impedance disturbance points in the data transmission lines.

12 Claims, 2 Drawing Sheets

DEVICE FOR DETECTING IMPEDANCE DISTURBANCE POINTS IN SYMMETRICAL DATA TRANSMISSION LINES

FILED OF THE INVENTION

The invention relates to a device for detecting impedance disturbance points in symmetrical data transmission lines.

BACKGROUND OF THE INVENTION

DE-C2-42 05 241 has already disclosed a data transmission device by means of which a bidirectional, isolated data transmission can be carried out between a master stage and a slave stage. This takes place using a coupling loop and a Hall-voltage measuring device. The Hall-voltage measuring device is realized together with a signal processing circuit in the form of an integrated circuit. Data are sent back from the slave stage to the master stage using an interrupter stage which interrupts the current in the bus line in a defined way. An evaluation of the pulse duty ratio in a comparison circuit of the master stage makes it possible to detect a reported-back logical status.

The applicant's EP-A1-0 875 995 likewise discloses an integrated data transmission circuit with potential separation between the input circuit and output circuit. The input circuit has an input for binary input signals. The output circuit contains an integrated, magnetosensitive coupling element and at least one output which is driven by the coupling element and via which binary output signals can be emitted. To permit the data transmission mentioned, line means are provided in order to conduct input signals into the proximity of the coupling element in a way separating the voltage potentials in the input circuit and output circuit. An integrated Hall generator may be used as the coupling element.

In the case of symmetrical, shielded and unshielded data transmission lines, disturbances may occur during operation, attributable to short circuits or line interruptions. Disturbances of this type have until now been detected and localized by using service personnel in offline operation. This involves using complicated measuring instruments and making use of the personnel's expertise.

SUMMARY OF THE INVENTION

Setting out from this prior art, the invention is based on the object of showing a new way in which the detection of impedance disturbance points in symmetrical data transmission lines can be improved.

This object is achieved by a device with the features specified in claim 1. Advantageous refinements and developments of the invention emerge from the dependent claims.

The advantages of the invention are, in particular, that the claimed detection of impedance disturbance points takes place in an isolated manner. The modules necessary for realizing the evaluation unit can be made in the form of an integrated circuit. This makes it possible in a simple way for the lines to be permanently monitored during operation without any reactions, so that disturbances occurring are automatically signaled by the output of an associated fault signal. The invention can be used for example in all bus systems with differential signal transmission, for example what is known as the Profibus.

BRIEF DESCRIPTION OF THE DRAWINGS

Further advantageous properties of the invention emerge from the explanation of exemplary embodiments with reference to figures, in which.

DETAILED DESCRIPTION OF THE PREFFERRED EMBODIMENTS

Figure 1:
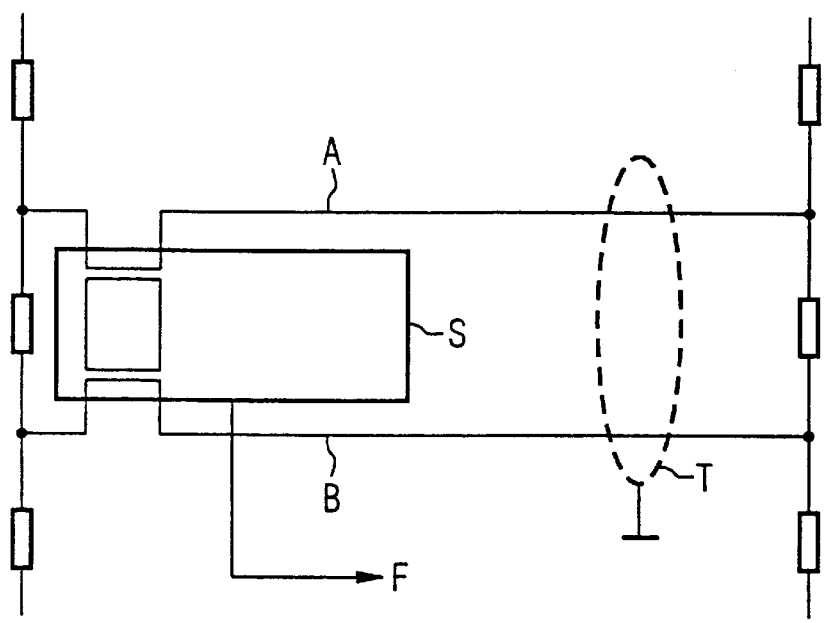
FIG. 1 shows a diagram to explain the basic principle of the invention.

FIG. 1 shows a diagram to explain the basic principle of the invention. The two conductor strands A and B of a bus system run parallel to each other and are surrounded by a shielding T. Provided between the conductor strands A and B is an evaluation unit S, which has at least two magnetosensitive elements and an evaluation circuit, as explained in more detail below in conjunction with FIGS. 2 and 3. Each of the two conductor strands is provided with a portion which is routed into direct proximity of one of the magnetosensitive elements of the evaluation unit S. The currents flowing in the conductor strands are detected by means of the magnetosensitive elements and fed to the evaluation circuit of the evaluation unit S. The determination of one or more fault signals F, made available at an output terminal of the circuit, then takes place in said evaluation unit.

It can be detected from these fault signals, for example, whether one of the conductor strands A or B has a short circuit with respect to the shielding or with respect to ground or whether there is a short circuit or an interruption within one of the conductor strands.

An isolated detection of impedance disturbance points of this type can take place not only in the case of shielded data transmission lines but also in the case of unshielded data transmission lines. It is ensured by the isolated detection that the lines mentioned can be monitored without any reactions. This means that the measuring or fault-diagnosis procedure taking place permanently and automatically during operation is carried out without any adverse effects on the transmitted signals themselves. This in turn has the advantage that the transmitter and the receiver of the transmitted data signals are also not disturbed in an undesired way.

Figure 2:
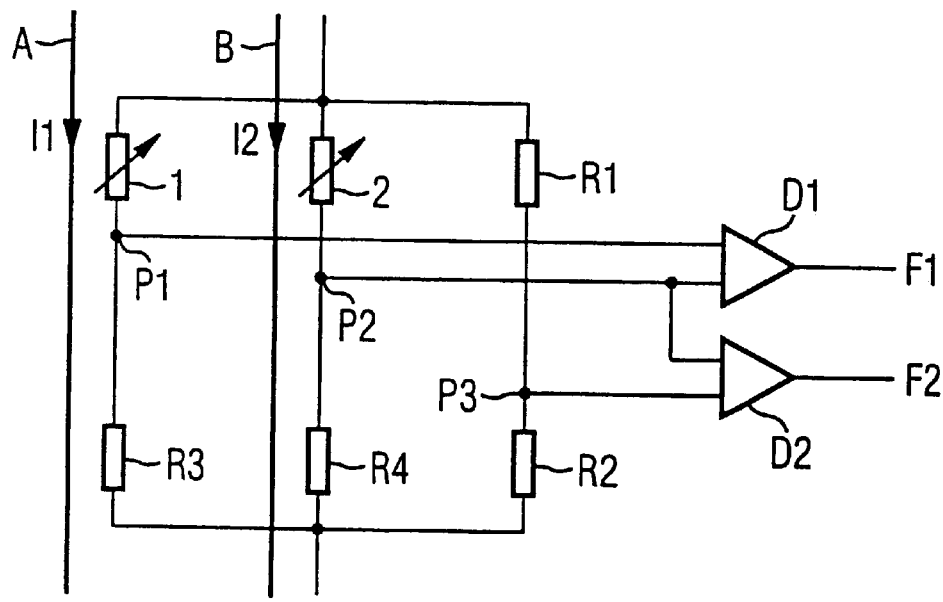
FIG. 2 shows a first exemplary embodiment of the invention.

FIG. 2 shows a first, more detailed exemplary embodiment of the invention. The device represented for detecting impedance disturbance points in symmetrical data transmission lines has two conductor strands A and B which run parallel to each other and over which data signals are transported in the form of currents I1 and I2. A first magnetosensitive element 1 is provided in the proximity of the conductor strand A. A second magnetosensitive element 2 is located in the proximity of the conductor strand B.

The magnetosensitive elements 1 and 2 are component parts of an evaluation unit which has a parallel circuit with three signal branches and which is provided furthermore with two differential amplifiers D1 and D2. The first signal branch contains a series connection of a first resistor R1 and a second resistor R2. In the second signal branch, a series connection of the second magnetosensitive element 2 and a fourth resistor R4 is provided. The third signal branch contains a series connection of the first magnetosensitive element 1 and a third resistor R3.

The connecting point P1 between the first magnetosensitive element 1 and the third resistor R3 is connected to one input of the differential amplifier D1. The second input of the differential amplifier D1 is connected to the connecting point P2, which is located between the second magnetosensitive element 2 and the fourth resistor R4.

The connecting point P2 is connected furthermore to the first input of the differential amplifier D2. Signals derived from the connecting point P3, which lies between the resistors R1 and R2 in the first signal branch, are fed to its second input.

Available at the output of the differential amplifier D1 is a fault signal F1, which provides information on whether one of the two conductor strands A or B has a short circuit with respect to the line shielding or with respect to ground.

The signal provided at the output of the differential amplifier D2 contains information on whether one of the conductor strands A or B itself has a short circuit or an interruption.

Figure 3:
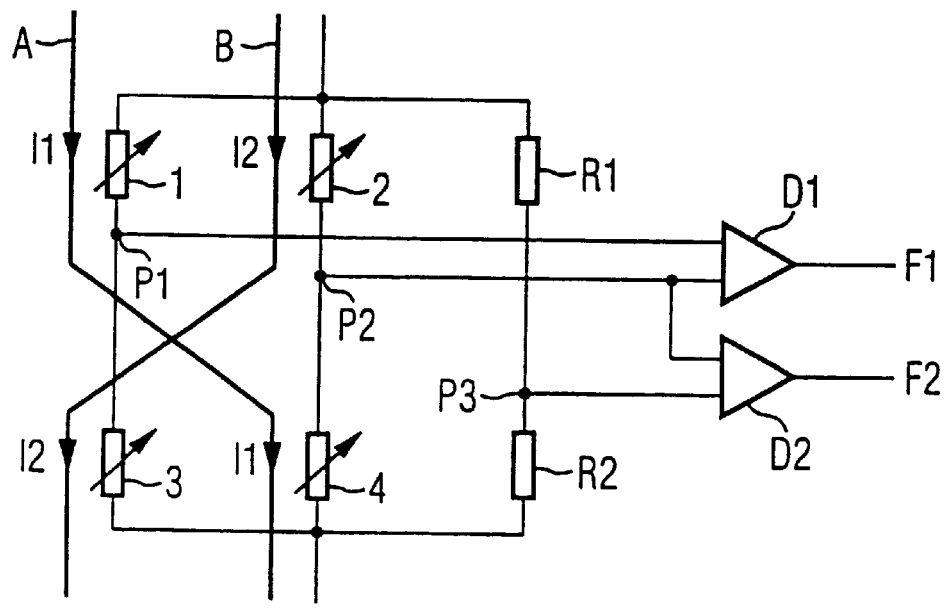
FIG. 3 shows a second exemplary embodiment of the invention.

FIG. 3 shows a second, more detailed exemplary embodiment of the invention. The device represented for detecting impedance disturbance points in symmetrical data transmission lines has two twisted conductor strands A and B, over which data signals are transported in the form of currents I1 and I2. A first magnetosensitive element 1 is provided in the proximity of the conductor strand A. A second magnetosensitive element 2 is located in the proximity of the conductor strand B.

The magnetosensitive elements 1 and 2 are component parts of an evaluation unit, which has a parallel connection with three signal branches and which, furthermore, is provided with two differential amplifiers D1 and D2. The first signal branch contains a series connection of a first resistor R1 and a second resistor R2. In the second signal branch, a series connection of a second magnetosensitive element 2 and a fourth magnetosensitive element 4 is provided. The third signal branch contains a series connection of the first magnetosensitive element 1 and a third magnetosensitive element 3.

On account of the twisting of the conductor strands A and B, the magnetosensitive elements 1 and 4 are positioned in the proximity of the conductor strand A and the magnetosensitive elements 2 and 3 are positioned in the proximity of the conductor strand B.

The connecting point P1 between the first magnetosensitive element 1 and the third resistor R3 is connected to one input of a differential amplifier D1. The second input of the differential amplifier D1 is connected to the connecting point P2, which is located between the second magnetosensitive element 2 and the fourth magnetosensitive element 4.

The connecting point P2 is connected furthermore to the first input of the differential amplifier D2. Signals derived from the connecting point P3, which lies between the resistors R1 and R2 in the first signal branch, are fed to its second input.

Available at the output of the differential amplifier D1 is a fault signal F1, which provides information on whether one of the two conductor strands A or B has a short circuit with respect to the line shielding or with respect to ground.

The signal provided at the output of the operational amplifier D2 contains information on whether one of the conductor strands A or B itself has a short circuit or an interruption.

The magnetosensitive elements 1, 2, 3 and 4 represented in FIGS. 2 and 3 are preferably Hall-effect elements, at each of which a Hall voltage can be picked off. This is induced by the magnetic field generated by the current flow in the respective conductor strand.

The entire evaluation unit, which comprises both the magnetosensitive elements and the evaluation circuit with the resistors and the differential amplifiers, is preferably realized in the form of a monolithically integrated circuit.

The monitoring of the data transmission lines with regard to the occurrence of impedance disturbance points such as short circuits or interruptions takes place automatically and permanently during operation. In this way, disturbance points in bus systems can be detected and localized without great expenditure on personnel and measuring instruments.

Patent Claims

Prior International application PCT/DE00/00540, having an international filing date of Feb. 25, 2000 is hereby incorporated by reference in its entirety.

What is claimed is:

1. A device for detecting impedance disturbance points in symmetrical data transmission lines having first and second conductor strands, comprising: an evaluation unit having at least two magnetosensitive elements, one of the magnetosensitive elements being positioned in the proximity of the first conductor strand and a second one of the magnetosensitive elements being positioned in the proximity of the second conductor strand, wherein the evaluation unit comprises an evaluation circuit connected to the magnetosensitive elements which supplies a fault signal at an output terminal;

wherein the evaluation circuit comprises a first differential amplifier, which supplies at its output terminal a fault signal indicating at least one of a short circuit of a conductor strand with respect to a shielding element or with respect to ground;

wherein the evaluation circuit comprises a second differential amplifier, which supplies at its output terminal a fault signal indicating at least one of a short circuit between the two conductor strands or an interruption of one of the two conductor strands;

wherein the first and second conductor strands run parallel to each other and the evaluation unit has a parallel connection with first, second and third signal branches, the first signal branch having a series connection of a first resistor and a second resistor, the second signal branch having a series connection of the second magnetosensitive element and a fourth resistor and the third signal branch having a series connection of the first magnetosensitive element and third resistor; and wherein a first input of the first differential amplifier is connected to the connecting point between the first magnetosensitive element and the third resistor and a second input of the first differential amplifier is connected to the connecting point between the second magnetosensitive element and the fourth resistor.

2. A device for detecting impedance disturbance points in symmetrical data transmission lines having first and second conductor strands, comprising: an evaluation unit having at least two magnetosensitive elements, one of the magnetosensitive elements being positioned in the proximity of the first conductor strand and a second one of the magnetosensitive elements being positioned in the proximity of the second conductor strand, wherein the evaluation unit comprises an evaluation circuit connected to the magnetosensitive elements which supplies a fault signal at an output terminal;

wherein the evaluation circuit comprises a first differential amplifier, which supplies at its output terminal a fault signal indicating at least one of a short circuit of a conductor strand with respect to a shielding element or with respect to ground;

wherein the evaluation circuit comprises a second differential amplifier, which supplies at its output terminal a fault signal indicating at least one of a short circuit between the two conductor strands or an interruption of one of the two conductor strands;

wherein the first and second conductor strands run parallel to each other and the evaluation unit has a parallel connection with first, second and third signal branches, the first signal branch having a series connection of a first resistor and a second resistor, the second signal branch having a series connection of the second magnetosensitive element and a fourth resistor and the third signal branch having a series connection of the first magnetosensitive element and third resistor;

wherein a first input of the first differential amplifier is connected to the connecting point between the first magnetosensitive element and the third resistor and a second input of the first differential amplifier is connected to the connecting point between the second magnetosensitive element and the fourth resistor; and wherein a first input of the second differential amplifier is connected to the connecting point between the second magnetosensitive element and the fourth resistor and a second input of the second differential amplifier is connected to the connecting point between the first resistor and the second resistor.

3. A device for detecting impedance disturbance points in symmetrical data transmission lines having first and second conductor strands, comprising: an evaluation unit having at least two magnetosensitive elements, one of the magnetosensitive elements being positioned in the proximity of the first conductor strand and a second one of the magnetosensitive elements being positioned in the proximity of the second conductor strand, wherein the evaluation unit comprises an evaluation circuit connected to the magnetosensitive elements which supplies a fault signal at an output terminal;

wherein the evaluation circuit comprises a first differential amplifier, which supplies at its output terminal a fault signal indicating at least one of a short circuit of a conductor strand with respect to a shielding element or with respect to ground;

wherein the evaluation circuit comprises a second differential amplifier, which supplies at its output terminal a fault signal indicating at least one of a short circuit between the two conductor strands or an interruption of one of the two conductor strands; and wherein the first and second conductor strands are twisted with each other and the evaluation unit has a parallel connection with first, second and third signal branches, the first signal branch having a series connection of a first resistor and a second resistor, the second signal branch having a series connection of the second magnetosensitive element and a fourth magnetosensitive element and the third signal branch having a series connection of the first magnetosensitive element and third magnetosensitive element.

4. A device for detecting impedance disturbance points in symmetrical data transmission lines having first and second conductor strands, comprising: an evaluation unit having at least two magnetosensitive elements, one of the magnetosensitive elements being positioned in the proximity of the first conductor strand and a second one of the magnetosensitive elements being positioned in the proximity of the second conductor strand, wherein the evaluation unit comprises an evaluation circuit connected to the magnetosensitive elements which supplies a fault signal at an output terminal;

wherein the evaluation circuit comprises a first differential amplifier, which supplies at its output terminal a fault signal indicating at least one of a short circuit of a conductor strand with respect to a shielding element or with respect to ground;

wherein the evaluation circuit comprises a second differential amplifier, which supplies at its output terminal a fault signal indicating at least one of a short circuit between the two conductor strands or an interruption of one of the two conductor strands;

wherein the first and second conductor strands are twisted with each other and the evaluation unit has a parallel connection with first, second and third signal branches, the first signal branch having a series connection of a first resistor and a second resistor, the second signal branch having a series connection of the second magnetosensitive element and a fourth magnetosensitive element and the third signal branch having a series connection of the first magnetosensitive element and third magnetosensitive element; and wherein a first input of the first differential amplifier is connected to the connecting point between the first magnetosensitive element and the third magnetosensitive element and a second input of the first differential amplifier is connected to the connecting point between the second magnetosensitive element and the fourth magnetosensitive element.

5. A device for detecting impedance disturbance points in symmetrical data transmission lines having first and second conductor strands, comprising: an evaluation unit having at least two magnetosensitive elements, one of the magnetosensitive elements being positioned in the proximity of the first conductor strand and a second one of the magnetosensitive elements being positioned in the proximity of the second conductor strand, wherein the evaluation unit comprises an evaluation circuit connected to the magnetosensitive elements which supplies a fault signal at an output terminal;

wherein the evaluation circuit comprises a first differential amplifier, which supplies at its output terminal a fault signal indicating at least one of a short circuit of a conductor strand with respect to a shielding element or with respect to ground;

wherein the evaluation circuit comprises a second differential amplifier, which supplies at its output terminal a fault signal indicating at least one of a short circuit between the two conductor strands or an interruption of one of the two conductor strands;

wherein the first and second conductor strands are twisted with each other and the evaluation unit has a parallel connection with first, second and third signal branches, the first signal branch having a series connection of a first resistor and a second resistor, the second signal branch having a series connection of the second magnetosensitive element and a fourth magnetosensitive element and the third signal branch having a series connection of the first magnetosensitive element and third magnetosensitive element;

wherein a first input of the first differential amplifier is connected to the connecting point between the first magnetosensitive element and the third magnetosensitive element and a second input of the first differential amplifier is connected to the connecting point between the second magnetosensitive element and the fourth magnetosensitive element; and wherein a first input of the second differential amplifier is connected to the connecting point between the second magnetosensitive element and the fourth magnetosensitive element and a second input of the second differential amplifier is connected to the connecting point between the first resistor and the second resistor.

6. A device for detecting impedance disturbance points in symmetrical data transmission lines having first and second conductor strands, comprising: an evaluation unit having at least two magnetosensitive elements, one of the magnetosensitive elements being positioned in the proximity of the first conductor strand and a second one of the magnetosensitive elements being positioned in the proximity of the second conductor strand, wherein the evaluation unit comprises an evaluation circuit connected to the magnetosensitive elements which supplies a fault signal at an output terminal;

wherein the evaluation circuit comprises a first differential amplifier, which supplies at its output terminal a fault signal indicating at least one of a short circuit of a conductor strand with respect to a shielding element or with respect to ground;

wherein the evaluation circuit comprises a second differential amplifier, which supplies at its output terminal a fault signal indicating at least one of a short circuit between the two conductor strands or an interruption of one of the two conductor strands;

wherein the first and second conductor strands are twisted with each other and the evaluation unit has a parallel connection with first, second and third signal branches, the first signal branch having a series connection of a first resistor and a second resistor, the second signal branch having a series connection of the second magnetosensitive element and a fourth magnetosensitive element and the third signal branch having a series connection of the first magnetosensitive element and third magnetosensitive element;

wherein a first input of the first differential amplifier is connected to the connecting point between the first magnetosensitive element and the third magnetosensitive element and a second input of the first differential amplifier is connected to the connecting point between the second magnetosensitive element and the fourth magnetosensitive element;

wherein a first input of the second differential amplifier is connected to the connecting point between the second magnetosensitive element and the fourth magnetosensitive element and a second input of the second differential amplifier is connected to the connecting point between the first resistor and the second resistor; and wherein the evaluation unit comprises an integrated circuit.

7. A device for detecting impedance disturbance points in symmetrical data transmission lines having first and second conductor strands, comprising: an evaluation unit having at least two magnetosensitive elements, one of the magnetosensitive elements being positioned in the proximity of the first conductor strand and a second one of the magnetosensitive elements being positioned in the proximity of the second conductor strand, wherein the evaluation unit comprises an evaluation circuit connected to the magnetosensitive elements which supplies a fault signal at an output terminal;

wherein the evaluation circuit comprises a first differential amplifier, which supplies at its output terminal a fault signal indicating at least one of a short circuit of a conductor strand with respect to a shielding element or with respect to ground;

wherein the evaluation circuit comprises a second differential amplifier, which supplies at its output terminal a fault signal indicating at least one of a short circuit between the two conductor strands or an interruption of one of the two conductor strands;

wherein the first and second conductor strands are twisted with each other and the evaluation unit has a parallel connection with first, second and third signal branches, the first signal branch having a series connection of a first resistor and a second resistor, the second signal branch having a series connection of the second magnetosensitive element and a fourth magnetosensitive element and the third signal branch having a series connection of the first magnetosensitive element and third magnetosensitive element;

wherein a first input of the first differential amplifier is connected to the connecting point between the first magnetosensitive element and the third magnetosensitive element and a second input of the first differential amplifier is connected to the connecting point between the second magnetosensitive element and the fourth magnetosensitive element;

wherein a first input of the second differential amplifier is connected to the connecting point between the second magnetosensitive element and the fourth magnetosensitive element and a second input of the second differential amplifier is connected to the connecting point between the first resistor and the second resistor;

wherein the evaluation unit comprises an integrated circuit; and wherein the evaluation unit permanently monitors the data transmission lines.

8. A device for detecting impedance disturbance points in symmetrical data transmission lines having first and second conductor strands, comprising: an evaluation unit having at least two magnetosensitive elements, one of the magnetosensitive elements being positioned in the proximity of the first conductor strand and a second one of the magnetosensitive elements being positioned in the proximity of the second conductor strand, wherein the evaluation unit comprises an evaluation circuit connected to the magnetosensitive elements which supplies a fault signal at an output terminal;

wherein the evaluation circuit comprises a first differential amplifier, which supplies at its output terminal a fault signal indicating at least one of a short circuit of a conductor strand with respect to a shielding element or with respect to ground;

wherein the evaluation circuit comprises a second differential amplifier, which supplies at its output terminal a fault signal indicating at least one of a short circuit between the two conductor strands or an interruption of one of the two conductor strands;

wherein the first and second conductor strands are twisted with each other and the evaluation unit has a parallel connection with first, second and third signal branches, the first signal branch having a series connection of a first resistor and a second resistor, the second signal branch having a series connection of the second magnetosensitive element and a fourth magnetosensitive element and the third signal branch having a series connection of the first magnetosensitive element and third magnetosensitive element;

wherein a first input of the first differential amplifier is connected to the connecting point between the first magnetosensitive element and the third magnetosensitive element and a second input of the first differential amplifier is connected to the connecting point between the second magnetosensitive element and the fourth magnetosensitive element;

wherein a first input of the second differential amplifier is connected to the connecting point between the second magnetosensitive element and the fourth magnetosensitive element and a second input of the second differential amplifier is connected to the connecting point between the first resistor and the second resistor;

wherein the evaluation unit comprises an integrated circuit;

wherein the evaluation unit permanently monitors the data transmission lines; and wherein the device is a component part of a data bus system.

9. A device for detecting impedance disturbance points in symmetrical data transmission lines having first and second conductor strands, comprising: an evaluation unit having at least two magnetosensitive elements, one of the magnetosensitive elements being positioned in the proximity of the first conductor strand and a second one of the magnetosensitive elements being positioned in the proximity of the second conductor strand, wherein the evaluation unit comprises an evaluation circuit connected to the magnetosensitive elements which supplies a fault signal at an output terminal;

wherein the evaluation circuit comprises a first differential amplifier, which supplies at its output terminal a fault signal indicating at least one of a short circuit of a conductor strand with respect to a shielding element or with respect to ground;

wherein the evaluation circuit comprises a second differential amplifier, which supplies at its output terminal a fault signal indicating at least one of a short circuit between the two conductor strands or an interruption of one of the two conductor strands;

wherein the first and second conductor strands are twisted with each other and the evaluation unit has a parallel connection with first, second and third signal branches, the first signal branch having a series connection of a first resistor and a second resistor, the second signal branch having a series connection of the second magnetosensitive element and a fourth magnetosensitive element and the third signal branch having a series connection of the first magnetosensitive element and third magnetosensitive element;

wherein a first input of the first differential amplifier is connected to the connecting point between the first magnetosensitive element and the third magnetosensitive element and a second input of the first differential amplifier is connected to the connecting point between the second magnetosensitive element and the fourth magnetosensitive element;

wherein a first input of the second differential amplifier is connected to the connecting point between the second magnetosensitive element and the fourth magnetosensitive element and a second input of the second differential amplifier is connected to the connecting point between the first resistor and the second resistor;

wherein the evaluation unit comprises an integrated circuit;

wherein the evaluation unit permanently monitors the data transmission lines;

wherein the device is a component part of a data bus system; and wherein the magnetosensitive elements are Hall-effect elements.

10. A device for detecting impedance disturbance points in symmetrical data transmission lines having first and second conductor strands, the device comprising: an evaluation unit having at least two magnetosensitive elements, one of the magnetosensitive elements being positioned in the proximity of the first conductor strand and a second one of the magnetosensitive elements being positioned in the proximity of the second conductor strand, wherein the evaluation unit comprises an evaluation circuit connected to the magnetosensitive elements which supplies a fault signal at an output terminal, and wherein the first and second strands run parallel to each other and the evaluation unit has a parallel connection with first, second and third signal branches, the first signal branch having a series connection of a first resistor and a second resistor, the second signal branch having a series connection of the second magnetosensitive element and fourth resistor and the third signal branch having a series connection of the first magnetosensitive element and a third resistor; and wherein a first input of the first differential amplifier is connected to the connecting point between the first magnetosensitive element and the third resistor and a second input of the first differential amplifier is connected to the connecting point between the second magnetosensitive element and the fourth resistor.

11. A device for detecting impedance disturbance points in symmetrical data transmission lines having first and second conductor strands, the device comprising: an evaluation unit having at least two magnetosensitive elements, one of the magnetosensitive elements being positioned in the proximity of the first conductor strand and a second one of the magnetosensitive elements being positioned in the proximity of the second conductor strand, wherein the evaluation unit comprises an evaluation circuit connected to the magnetosensitive elements which supplies a fault signal at an output terminal, and wherein the first and second strands run parallel to each other and the evaluation unit has a parallel connection with first, second and third signal branches, the first signal branch having a series connection of a first resistor and a second resistor, the second signal branch having a series connection of the second magnetosensitive element and fourth resistor and the third signal branch having a series connection of the first magnetosensitive element and a third resistor;

wherein a first input of the first differential amplifier is connected to the connecting point between the first magnetosensitive element and the third resistor and a second input of the first differential amplifier is connected to the connecting point between the second magnetosensitive element and the fourth resistor; and wherein a first input of the second differential amplifier is connected to the connecting point between the second magnetosensitive element and the fourth resistor and a second input of the second differential amplifier is connected to the connecting point between the first resistor and the second resistor.

12. A device for detecting impedance disturbance points in symmetrical data transmission lines having first and second conductor strands, the device comprising: an evaluation unit having at least two magnetosensitive elements, one of the magnetosensitive elements being positioned in the proximity of the first conductor strand and a second one of the magnetosensitive elements being positioned in the proximity of the second conductor strand, wherein the evaluation unit comprises an evaluation circuit connected to the magnetosensitive elements which supplies a fault signal at an output terminal, and wherein the first and second strands run parallel to each other and the evaluation unit has a parallel connection with first second and third signal branches, the first signal branch having a series connection of a first resistor and a second resistor, the second signal branch having a series connection of the second magnetosensitive element and fourth resistor and the third signal branch having a series connection of the first magnetosensitive element and a third resistor;

wherein a first input of the first differential amplifier is connected to the connecting point between the first magnetosensitive element and the third resistor and a second input of the first differential amplifier is connected to the connecting point between the second magnetosensitive element and the fourth resistor;

wherein a first input of the second differential amplifier is connected to the connecting point between the second magnetosensitive element and the fourth resistor and a second input of the second differential amplifier is connected to the connecting point between the first resistor and the second resistor; and wherein the first and second conductor strands are twisted with each other and the evaluation unit has a parallel connection with first, second and third signal branches, the first signal branch having a series connection of a first resistor and a second resistor, the second signal branch having a series connection of the second magnetosensitive element and a fourth magnetosensitive element and the third signal branch having a series connection of the first magnetosensitive element and a third magnetosensitive element.

\* \* \* \* \*